(12) United States Patent
Katayama

(10) Patent No.: US 9,767,863 B2
(45) Date of Patent: Sep. 19, 2017

(54) REDUNDANCY MEMORY DEVICE COMPRISING A PLURALITY OF SELECTING CIRCUITS

(71) Applicant: TOSHIBA MEMORY CORPORATION, Minato-ku, Tokyo (JP)

(72) Inventor: Akira Katayama, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/066,685

(22) Filed: Mar. 10, 2016

(65) Prior Publication Data

US 2017/0076759 A1 Mar. 16, 2017

Related U.S. Application Data

(60) Provisional application No. 62/217,622, filed on Sep. 11, 2015.

(51) Int. Cl.
| | |
|---|---|
| *G11C 7/00* | (2006.01) |
| *G11C 29/00* | (2006.01) |
| *G11C 7/06* | (2006.01) |
| *G11C 7/10* | (2006.01) |
| *G11C 29/02* | (2006.01) |
| *G11C 5/06* | (2006.01) |
| *G11C 11/16* | (2006.01) |
| *G11C 13/00* | (2006.01) |
| *G11C 11/22* | (2006.01) |

(52) U.S. Cl.
CPC ............... *G11C 7/065* (2013.01); *G11C 5/06* (2013.01); *G11C 7/06* (2013.01); *G11C 7/106* (2013.01); *G11C 7/1069* (2013.01); *G11C 29/022* (2013.01); *G11C 29/026* (2013.01); *G11C 29/74* (2013.01); *G11C 11/1673* (2013.01); *G11C 11/2273* (2013.01); *G11C 13/0002* (2013.01); *G11C 13/004* (2013.01)

(58) Field of Classification Search
CPC .. G11C 7/06; G11C 7/065; G11C 5/06; G11C 7/106; G11C 7/1069; G11C 29/74; G11C 29/022; G11C 29/026
See application file for complete search history.

(56) References Cited

U.S. PATENT DOCUMENTS

| | | | | |
|---|---|---|---|---|
| 9,390,769 B1 * | 7/2016 | Bhatsoori | ............. | G11C 7/065 |
| 2001/0026483 A1 | 10/2001 | Hasegawa et al. | | |
| 2008/0298144 A1 * | 12/2008 | Yumoto | ................. | G11C 29/24 365/200 |

(Continued)

FOREIGN PATENT DOCUMENTS

| | | |
|---|---|---|
| JP | 05258591 A | 10/1993 |
| JP | 2013257919 A | 12/2013 |

*Primary Examiner* — Kretelia Graham
(74) *Attorney, Agent, or Firm* — Holtz, Holtz & Volek PC

(57) ABSTRACT

According to one embodiment, a memory device includes: a first storage area configured to store data; a first sense amplifier; a first data latch; a first selector configured to select either connection between the first data latch and the first sense amplifier or connection between the first data latch and another sense amplifier; and a second selector configured to select either connection between the first storage area and the first sense amplifier or connection between another storage area and the first sense amplifier.

18 Claims, 7 Drawing Sheets

(56) References Cited

U.S. PATENT DOCUMENTS

2011/0267914 A1* 11/2011 Ishikura .................. G11C 7/06
                                                      365/208
2015/0063013 A1*  3/2015 Iizuka .................. G11C 29/702
                                                      365/158

* cited by examiner

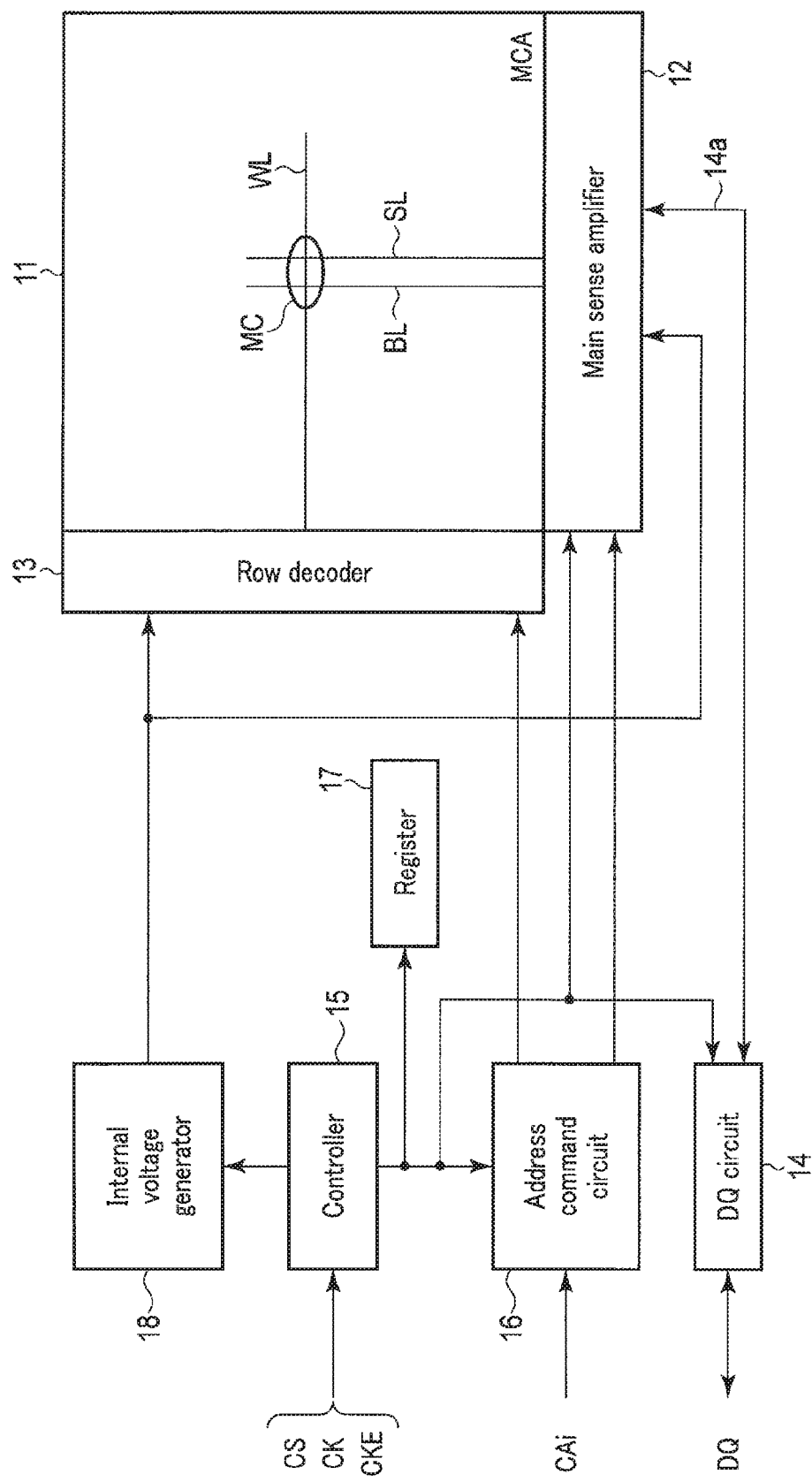
F I G. 1

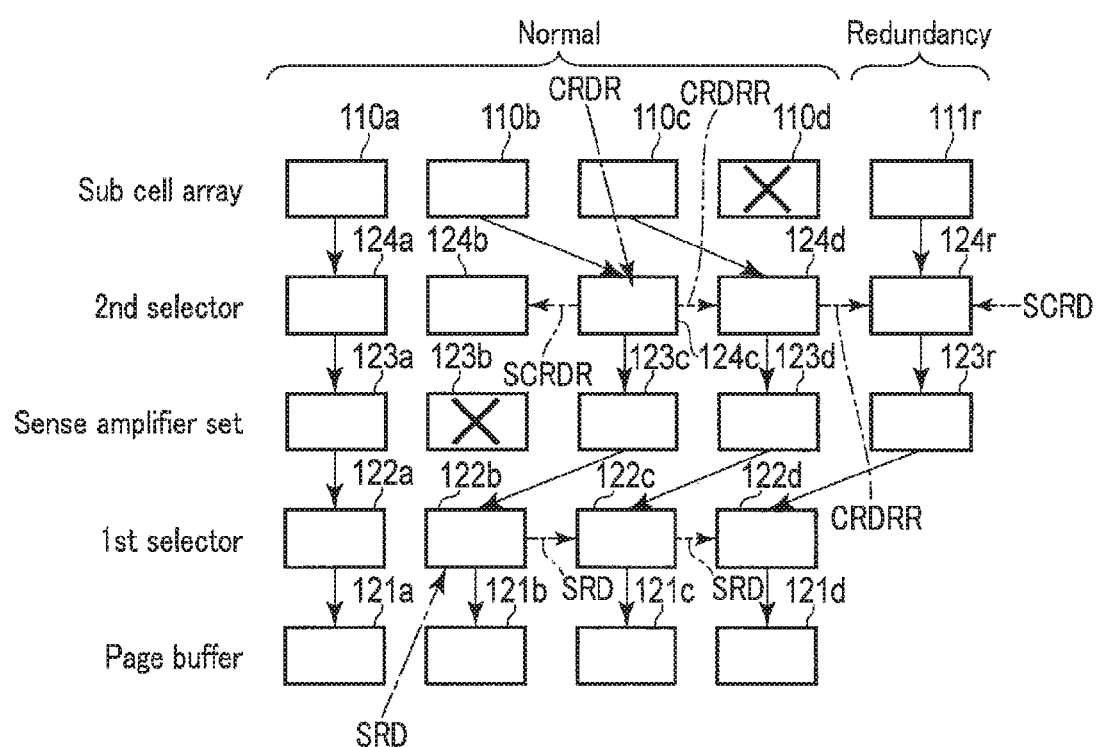
F I G. 10

US 9,767,863 B2

REDUNDANCY MEMORY DEVICE COMPRISING A PLURALITY OF SELECTING CIRCUITS

CROSS REFERENCE TO RELATED APPLICATIONS

This application claims the benefit of U.S. Provisional Application No. 62/217,622, filed Sep. 11, 2015, the entire contents of which are incorporated herein by reference.

FIELD

Embodiments described herein relate generally to a memory device.

BACKGROUND

In recent years, a resistance change type memory, such as a magnetic random access memory (MRAM), is attracting attention as a next-generation memory. An MRAM is a memory device that adopts a magnetic element having a magnetoresistive effect as a memory cell for storing information, and is featured by fast operation, large storage capacity and non-volatility. Research and development have been in progress to replace a volatile memory, such as a DRAM and an SRAM, with an MRAM. In order to lower the development cost and enable smooth replacement, the MRAM should desirably operate on the same specifications as the DRAM and SRAM.

BRIEF DESCRIPTION OF THE DRAWINGS

FIG. 1 is a block diagram of a semiconductor memory device according to an embodiment.
FIG. 10 is a diagram showing connection example 5 in which a memory cell array and a main sense amplifier are connected.

DETAILED DESCRIPTION

Figure 2:
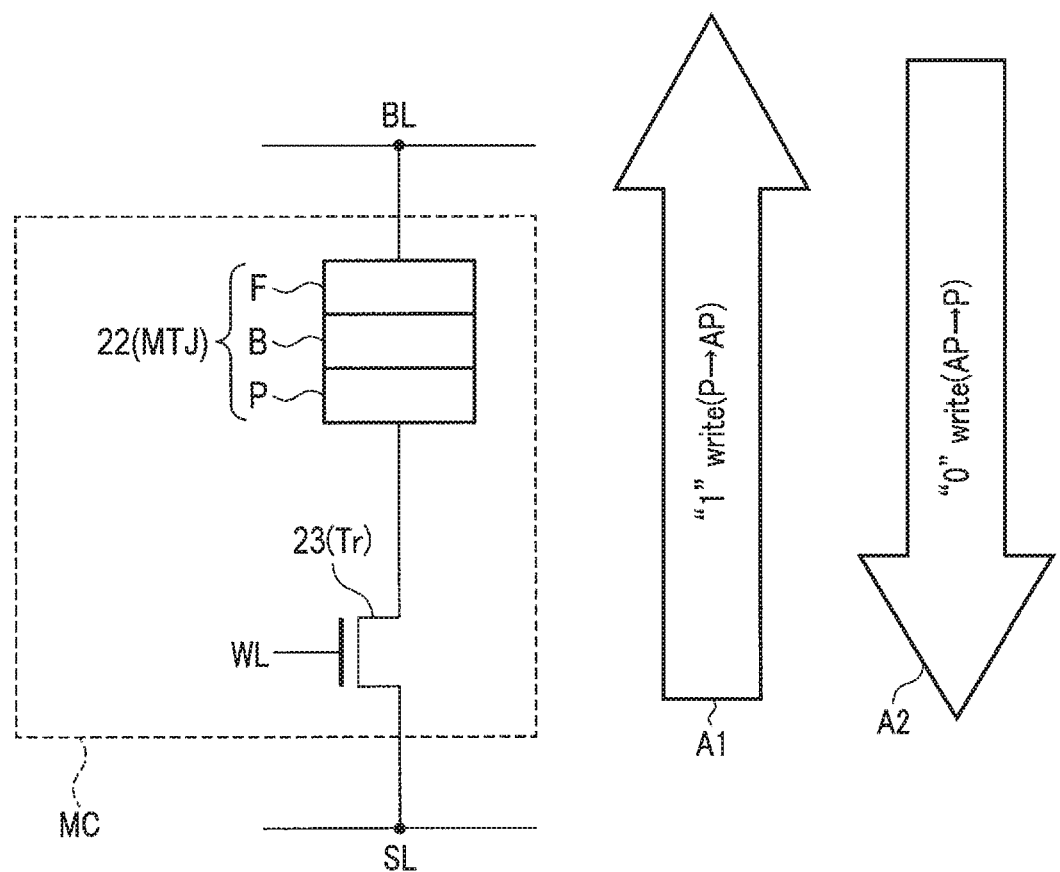
FIG. 2 illustrates a memory cell used in the embodiment.

In general, according to one embodiment, a memory device includes: a first storage area configured to store data; a first sense amplifier; a first data latch; a first selector configured to select either connection between the first data latch and the first sense amplifier or connection between the first data latch and another sense amplifier; and a second selector configured to select either connection between the first storage area and the first sense amplifier or connection between another storage area and the first sense amplifier.

A description will now be given of embodiments with reference to the accompanying drawings. In the description below, structural elements having substantially the same functions and configurations will be denoted by the same reference symbols.

Each of the embodiments described below merely shows an exemplary apparatus and method that implement the technical ideas of the embodiments. The technical ideas of the embodiments do no not limit the element materials, shapes, structures, arrangements etc. to those described below. The technical ideals of the embodiments may be varied within the range defined in the claims.

<1> First Embodiment

<1-1> Configuration of Semiconductor Memory Device of Embodiment

A schematic description will be given, with reference to FIG. 1, of the basic configuration of a memory device according to the embodiment. FIG. 1 is a block diagram of a semiconductor memory device according to the embodiment.

The semiconductor memory device 1 of the embodiment comprises: a memory cell array (which may be referred to simply as a cell array) 11, a main sense amplifier 12, a row decoder 13, a DQ circuit 14, a bus 14a, a controller 15, an address command circuit 16, a register 17, and an internal voltage generation circuit 18.

The memory cell array 11 is an MRAM comprising a plurality of memory cells MC arranged in a two-dimensional matrix pattern. Each memory cell MC includes an MTJ element 22 (not shown) and a cell transistor 23 (not shown). The MTJ element 22 is a magnetic tunnel junction element which stores data by utilizing resistance changes and enables the data to be rewritten by supplying current thereto. The cell transistor 23 is connected to the MTJ element, and is set in the conductive state when a current is supplied to the MTJ element.

The word lines WL extending in the row direction and the bit lines BL extending in the column direction intersect each other. The adjacent two bit lines BL form a pair, and a memory cell MC is provided at the intersection between word line WL and the bit line pair (which will be referred to as bit line BL and source line SL for descriptive purposes in the present embodiment). The MTJ element 22 and cell transistor 23 of each memory cell MC are connected in series and arranged in the bit line pair (e.g., between BL and SL). The gate of the cell transistor 23 is connected to word line WL. The bit line, source line, global bit line (mentioned below), and global source line (mentioned below) may be collectively referred to as a column. Likewise, the word line may be referred to as a row.

The main sense amplifier 12 recognizes a command or an address provided by command address signal CAi, based on an external control signal, and controls the bit lines BL and source lines SL.

The main sense amplifier 12 is connected to the bit lines BL, and reads data from a memory cell MC when it detects a current flowing through the memory cell MC connected to a selected word line WL. The main sense amplifier 12 writes data in the memory cell MC when it supplies a current to the memory cell MC connected to a selected word line WL. The specific configuration of the main sense amplifier 12 will be described later.

The data exchange between the main sense amplifier 12 and an external input/output terminal DQ is performed through the DQ circuit 14 and the bus 14a.

The row decoder 13 decodes the address of the command address signal CAi supplied from the address command circuit 16.

The row decoder 13 is connected to the word lines and applies a voltage to a selected word line WL when data is read or written. To be more specific, the row decoder 13 is configured to apply the voltage to the selected word line WL in accordance with the decoded row address.

The controller 15 receives various external control signals (such as a chip select signal CS, a clock signal CK, a clock enable signal CKE, etc.). The controller 15 controls the address command circuit 16 and discriminates addresses and commands from each other.

The address command circuit 16 receives a command address signal CAi. The address command circuit 16 transfers the command address signal CAi to the row decoder 13 and main sense amplifier 12.

The register 17 is a storage area for retaining various settings used for the operation of the semiconductor memory device. The register 17 may be a volatile storage area, a nonvolatile storage area, a ROM fuse, or the like. In the present embodiment, the register 17 stores defective sub cell array information, defective sense amplifier information, etc.

The internal voltage generation circuit 18 generates an internal voltage (e.g., a boosted voltage higher than a power supply voltage) required for each operation of the semiconductor memory device 1. Controlled by the controller 15, the internal voltage generation circuit 18 performs a voltage boost operation and generates a required voltage.

<1-2> Memory Cell

A schematic description will be given, with reference to FIG. 2, as to how the write operation is performed for memory cell MC according to the embodiment. FIG. 2 illustrates the write operation performed for the memory cell MC according to the embodiment.

As shown in FIG. 2, one end of the MTJ element 22 of the memory cell MC of the embodiment is connected to bit line BL, and the other end of the MTJ element 22 is connected to one end of the current path of the cell transistor 23. The other end of the current path of the cell transistor 23 is connected to source line SL. The MTJ element 22 utilizing the tunneling magnetoresistive (TMR) effect has a stack structure comprising two ferromagnetic layers F and P and a nonmagnetic layer (a tunnel insulation film) B sandwiched between the ferromagnetic layers F and P. The MTJ element stores digital data by utilization of variations in the magnetic resistance caused by a spin-polarized tunneling effect. The MTJ element 22 can be set in a low-resistance state or a high-resistance state in accordance with the magnetic orientations of the two ferromagnetic layers F and P. For example, if the low-resistance state is defined as data "0" and the high-resistance state is defined as data "1", 1-bit data can be recorded in the MTJ element 22. Needless to say, the low-resistance state may be defined as data "1" and the high-resistance state may be defined as data "0".

The MTJ element 22 is formed, for example, by stacking a fixing layer (pin layer) P, a tunnel barrier layer B and a recording layer (free layer) F in the order mentioned. The pin layer P and the free layer F are made of a ferromagnetic material, and the tunnel barrier layer B is an insulating film (such as Al2O3 or MgO). The pin layer P is a layer in which the magnetic orientation is fixed, while the free layer F is a layer in which the magnetic orientation is variable and which stores data utilizing the magnetic orientation.

When a current flows in the direction of arrow A1 in a write operation, the magnetic orientation of the free layer F becomes anti-parallel (AP state) with respect to the magnetic orientation of the pin layer P. As a result, a high-resistance state (data "1") is established. When a current flows in the direction of arrow A2 in a write operation, the magnetic orientation of the free layer F becomes parallel (P state) to the magnetic orientation of the pin layer P. As a result, a low-resistance state (data "0") is established. As can be seen, different data can be written in the MTJ element by changing the direction of a current flow. In the above explanation, the variable magnetic orientation means that the magnetization direction varies in response to a preset write current. The fixed magnetic orientation means that the magnetization direction does not vary in response to a preset write current.

<1-3> Configurations of Memory Cell Array and Main Sense Amplifier

Figure 3:
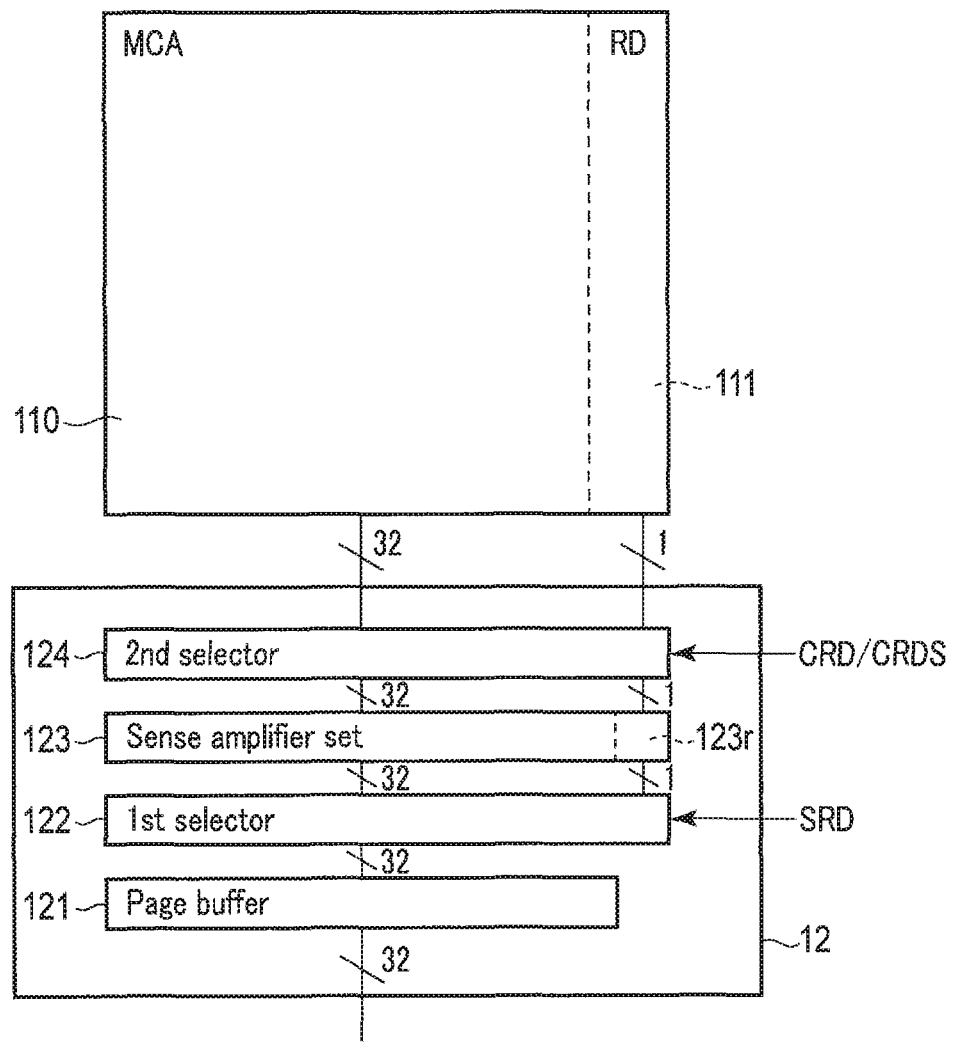
FIG. 3 is a diagram schematically showing a memory cell array and a main sense amplifier used in the embodiment.

A description will be given with reference to FIG. 3 of the configurations of the memory cell array and main sense amplifier of the embodiment. As shown in FIG. 3, the memory cell array 11 includes an ordinary storage area 110 and a redundancy area 111. The ordinary storage area 110 is provided with a plurality of sub cell arrays (not shown). The sub cell arrays are arranged in a matrix pattern. The ordinary storage area 110 is used for ordinary operations of reading, writing and erasing data.

The redundancy area 111 is provided with a plurality of redundancy sub cell arrays (not shown). The redundancy sub cell arrays are arranged in the column direction. The redundancy sub cell arrays are used if sub cell arrays are defective or if the sense amplifiers are defective. A specific example will be described later.

Each sub cell array includes a plurality of memory cells arranged in a matrix pattern. Each sub cell array is selectively connected to bit lines BL by way of a single global bit line GBL, and is selectively connected to source lines SL by way of a single global source line GSL.

The main sense amplifier 12 includes a page buffer 121, a first selector 122, a sense amplifier set 123 and a second selector 124.

Based on control signal CRD supplied from the controller 15, the second selector 124 switches or shifts connections between the global bit lines GBL and the sense amplifiers. In other words, the second selector 124 is a circuit for selecting a global bit line GBL (or sub arrays).

The sense amplifier set 123 includes a plurality of sense amplifiers (not shown). The sense amplifier is provided for each global bit line GBL. The sense amplifier set 123 is provided with a redundancy sense amplifier 123r for the redundancy area 111. Each sense amplifier reads data from a memory cell MC when it detects a current flowing through the memory cell MC connected to a selected word line WL.

Based on control signal SRD supplied from the controller 15, the first selector 122 switches or shifts connections between the sense amplifiers and the page buffers. As can be seen, the first selector 122 is a circuit for selecting a sense amplifier. The page buffer 121 stores data sensed by a sense amplifier. The stored data is supplied to the DQ circuit 14 by way of 32 wiring lines and the bus 14a.

In connection with the present embodiment, reference was made to the case where each memory cell array 11 is provided with 33 global bit lines GBL. However, the embodiment is not limited to this, and the number of global bit lines can be properly determined in accordance with the need.

<1-4> Connection Example 1 Between Memory Arrays and Main Sense Amplifier

Figure 4:
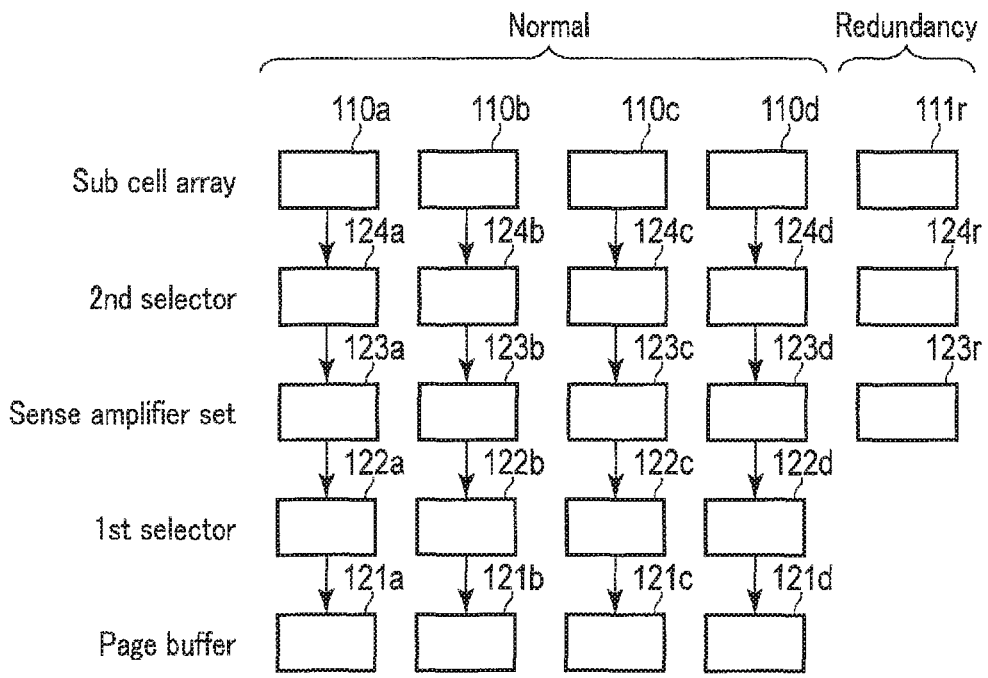
FIG. 4 is a diagram showing connection example 1 in which a memory cell array and a main sense amplifier are connected.

A description will be given, with reference to FIG. 4, of connection example 1 between the memory cell arrays and the main sense amplifier. Although there are 33 sub arrays in one row in the example shown in FIG. 3, only five of them (namely sub arrays 110*a*, 110*b*, 110*c*, 110*d* and 111*r*) are shown in FIG. 4, for the sake of simplicity. FIG. 4 illustrates the case where the sub arrays contain no defect and the sense amplifiers contain no defect. In the drawings, structural elements labeled as "x" (x: arbitrary letter of the alphabet) are structural elements related to group x. This is applicable to the other Figures of the drawings. To be more specific, second selector 124*a*, sense amplifier 123*a*, first selector 122*a* and page buffer 121*a* are structural elements basically used for reading data from sub cell array 110*a*.

As shown in FIG. 4, unless a defect exceeding an allowable value is present in a sub cell array or sense amplifiers, the redundancy area 111 is not used. The allowable value can be determined by the user. If the defect in the sub cell array or sense amplifier exceeds its allowable value, the sub cell array or the sense amplifier is regarded as unusable.

To be specific, second selector 124*a* electrically connects sub cell array 110*a* and sense amplifier 123*a* to each other, and first selector 122*a* electrically connects sense amplifier 123*a* and page buffer 121*a* to each other.

Second selector 124*b* electrically connects sub cell array 110*b* and sense amplifier 123*b* to each other, and first selector 122*b* electrically connects sense amplifier 123*b* and page buffer 121*b* to each other.

Second selector 124*c* electrically connects sub cell array 110*c* and sense amplifier 123*c* to each other, and first selector 122*c* electrically connects sense amplifier 123*c* and page buffer 121*c* to each other.

Second selector 124*d* electrically connects sub cell array 110*d* and sense amplifier 123*d* to each other, and first selector 122*d* electrically connects sense amplifier 123*d* and page buffer 121*d* to each other.

As described above, the first selector 122 and the second elector 124 do not switch groups unless they receive a control signal from the controller 15. In other words, the first selector 122 and the second selector 124 electrically connect the structural elements of the same group where they do not receive a control signal from the controller 15.

<1-5> Connection Example 2 Between Memory Arrays and Main Sense Amplifier

Figure 5:
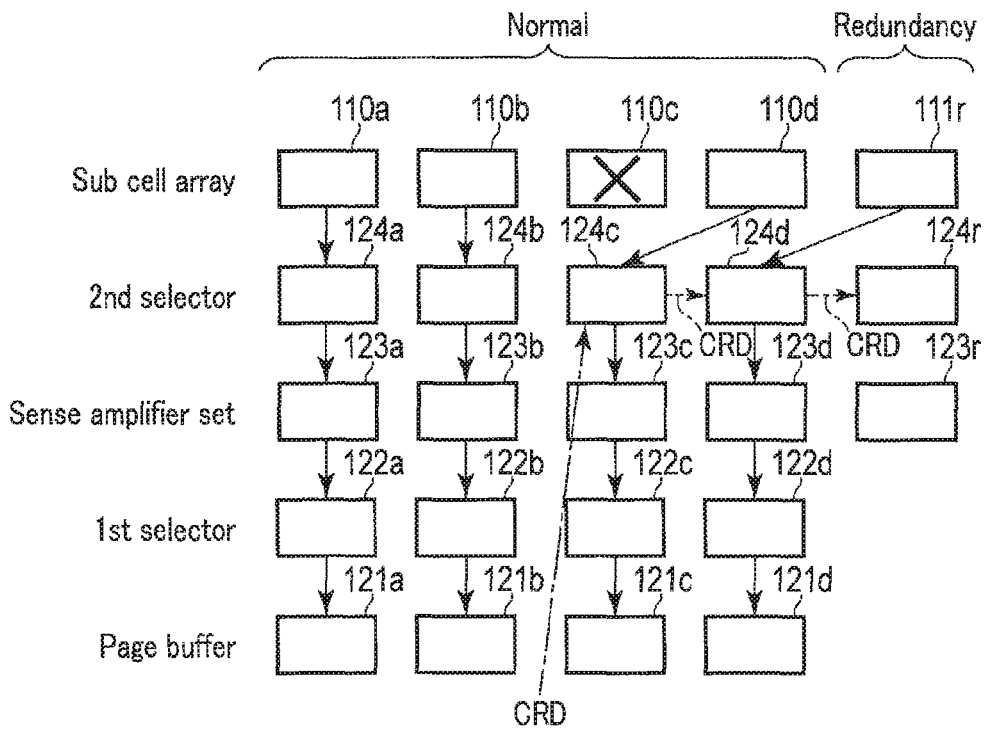
FIG. 5 is a diagram showing connection example 2 in which a memory cell array and a main sense amplifier are connected.

A description will be given, with reference to FIG. 5, of connection example 2 between the memory cell arrays and the main sense amplifier. In FIG. 5, only five sub cell arrays of a predetermined row, namely sub cell arrays 110*a*, 110*b*, 110*c*, 110*d* and 111*r*, are focused for the sake of simplicity. In connection with FIG. 5, reference will be made to the case where an unusable sub cell array is included.

In the test operation performed before the shipping of a semiconductor memory device, if the defect in sub cell array 110*c* of a row exceeds an allowable value, that sub cell array 110*c* is regarded as unusable.

If the sub array 110*c* of the row becomes unusable, the position information (address) on that sub array 110*c* is stored in the register 17, for example. The position information (address) on the sub array 110*c* is stored in the register 17 as "defect information on group c."

Upon receipt of an access request (a write request, a read request or the like) made to sub array 110*c* of the row, the controller 15 reads "defect information on group c" from the register 17. If the "defect information on group c" includes position information on sub array 110*c* for which the access request is made, the controller 15 supplies control signal CRD regarding sub array replacement to the second selector 124*c* of the same group (group c) as sub array 110*c*.

Upon receipt of control signal CRD, the second selector 124*c* is connected to sub cell array 110*d*, not to sub cell array 110*c*, i.e., to the sub cell array of the adjacent group located on the redundancy area side. Upon receipt of control signal CRD, the second selector 124*c* supplies control signal CRD to the adjacent second selector 124*d* located on the redundancy area side.

As a result, the second selector 124*d* is connected to sub cell array 110*r* of the adjacent group located on the redundancy area side, not to sub cell array 110*d*.

As described above, if sub cell array 110*c* to be accessed is registered in the register 17 as being inaccessible, the controller 15 supplies control signal CRD to the second selector 124*c* corresponding to the sub cell array 110*c*. As a result, the sub cell arrays shifted toward the redundancy area are used, thereby avoiding the use of sub cell array 110*c*.

<1-6> Connection Example 3 Between Memory Arrays and Main Sense Amplifier

Figure 6:
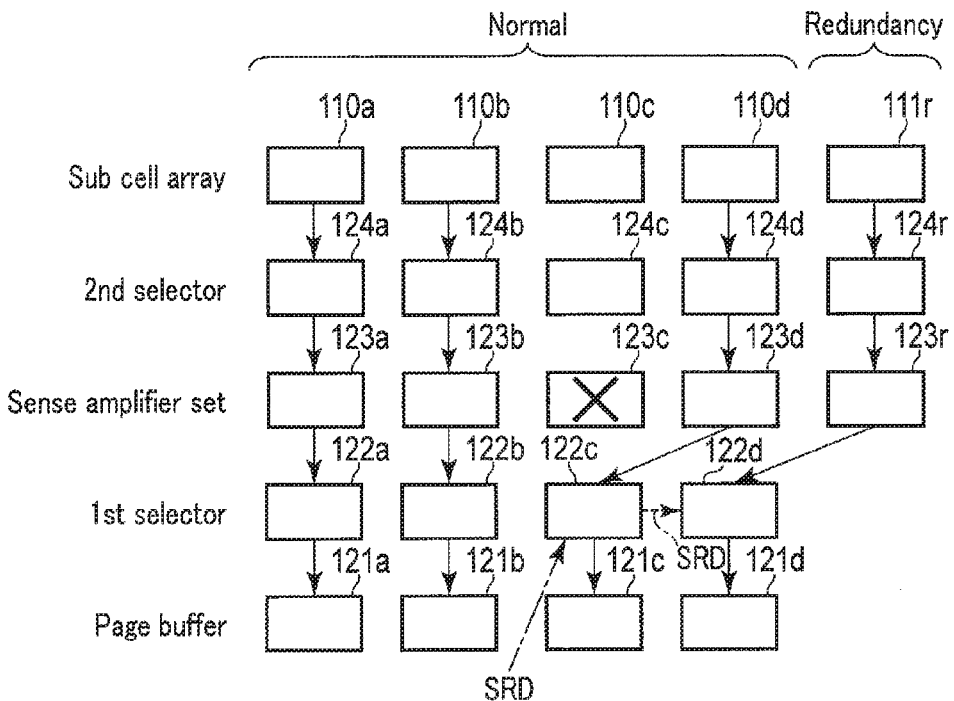
FIG. 6 is a diagram showing connection example 3 in which a memory cell array and a main sense amplifier are connected.

A description will be given, with reference to FIG. 6, of connection example 3 between the memory cell arrays and the main sense amplifier. In FIG. 6, only five sub cell arrays of a predetermined row, namely sub cell arrays 110*a*, 110*b*, 110*c*, 110*d* and 111*r*, are focused for the sake of simplicity. In connection with FIG. 6, reference will be made to the case where an unusable sense amplifier is included.

In the test operation performed before the shipping of a semiconductor memory device, if the defect in sense amplifier 123*c* exceeds an allowable value, that sense amplifier 123*c* is regarded as unusable.

If the sense amplifier 123*c* becomes unusable, the position information (address) on that sense amplifier 123*c* is stored in the register 17, for example. The position information (address) on the sense amplifier 123*c* is stored in the register 17 as "defect information on group c."

Upon receipt of an access request made to sub array 110*c* which belongs to the same group as sense amplifier 123*c*, the controller 15 reads "defect information on group c" from the register 17. Based on "defect information on group c", the controller 15 supplies control signal SRD regarding sense amplifier replacement to the first selector 122*c* of the same group (group c) as sub array 110*c*.

As a result, the first selector 122*c* is connected to sense amplifier 123*d* of the adjacent group located on the redundancy area side, not to sense amplifier 123*c*. Upon receipt of control signal SRD, the first selector 122*c* supplies control signal SRD to the first selector 122*d* adjacent to the redundancy area.

As a result, the first selector 122*d* is connected to sense amplifier 123*r* of the adjacent group located on the redundancy area side, not to sense amplifier 123*d*.

As described above, if sense amplifier 123*c* to be accessed is recorded in the register 17 as being inaccessible, the controller 15 supplies control signal SRD to the first selector 122*c* corresponding to the sense amplifier 123*c*. As a result, the sense amplifiers shifted toward the redundancy area are used, thereby avoiding the use of sense amplifier 123*c*.

<1-7> Connection Example 4 Between Memory Arrays and Main Sense Amplifier

Figure 7:
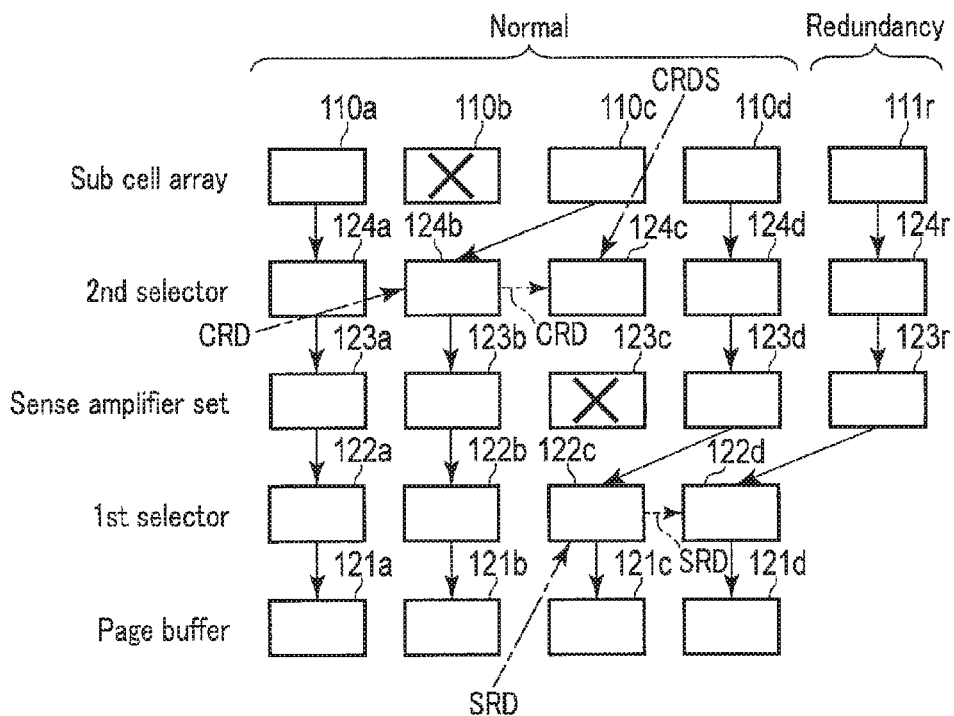
FIG. 7 is a diagram showing connection example 4 in which a memory cell array and a man sense amplifier are connected.

A description will be given, with reference to FIG. 7, of connection example 4 between the memory cell arrays and the main sense amplifier. In FIG. 7, only five sub cell arrays of a predetermined row, namely sub cell arrays 110a, 110b, 110c, 110d and 111r, are focused for the sake of simplicity. In connection with FIG. 7, reference will be made to the case where an unusable sub cell array and an unusable sense amplifier are included. In FIG. 7, it is assumed that the group including an unusable sense amplifier is located closer to the redundancy area than the group including an unusable cell array.

In the test operation performed before the shipping of a semiconductor memory device, if the defect in sub cell array 110b in a row exceeds an allowable value, that sub cell array 110b is regarded as unusable. Likewise, if the defect in sense amplifier 123c exceeds an allowable value, that sense amplifier is regarded as being unusable.

If the sub cell array 110b becomes unusable, the position information (address) on that sub cell array 110b is stored in the register 17, for example. The position information (address) on the sub array 110b is stored in the register 17 as "defect information on group b."

If the sense amplifier 123c becomes unusable, the position information (address) on that sense amplifier 123c is stored in the register 17, for example. The position information (address) on sense amplifier 123c is stored in the register 17 as "defect information on group c."

Upon receipt of an access request made to sub array 110b and sub array 110c, the controller 15 reads "defect information on group b" and "defect information on group c" from the register 17. The controller 15 recognizes that the group including an unusable sense amplifier is closer to the redundancy area than the group including an unusable cell array. Based on the "defect information on group b", the controller 15 supplies control signal CRD to the second selector 124b of the same group (group b) as sub array 110b. Based on the "defect information on group c", the controller 15 also supplies control signal SRD to the first selector 122c of the same group (group c) as sub array 110c.

Upon receipt of control signal CRD, the second selector 124b is connected to sub cell array 110c of the adjacent group located on the redundancy area side, not to sub cell array 110b. Upon receipt of control signal CRD, the second selector 124b supplies control signal CRD to the adjacent second selector 124c located on the redundancy area side.

The controller 15 supplies control signal CRDS to the second selector 124c of the group including the sense amplifier that should not be used. As a result, the second selector 124c does not perform a switching operation when it receives control signal CRD from the second selector 124b.

Upon receipt of control signal SRD, the first selector 122c is connected to the sense amplifier 123d of the adjacent group located on the redundancy area side, not to sense amplifier 123c. Upon receipt of control signal SRD, the first selector 122c supplies control signal SRD to the adjacent first selector 122d located on the redundancy area side.

As a result, the first selector 122d is connected to the adjacent sense amplifier 123r located on the redundancy area side, not to sense amplifier 123d.

As described above, where the group including a defective sense amplifier is closer to the redundancy area than the group including a defective cell array, proper replacement is enabled by the first and second selectors even if the shift redundancy system is used.

<1-8> Advantage of Embodiment

According to the embodiment described above, the semiconductor memory device comprises both a selector for switching sub cell arrays and a selector for switching sense amplifiers. Owing to this, a sub cell array and a sense amplifier can be efficiently saved with no need to additionally employ a redundancy area.

A description will be given of comparative example 1 with reference to FIG. 8.

Figure 8:
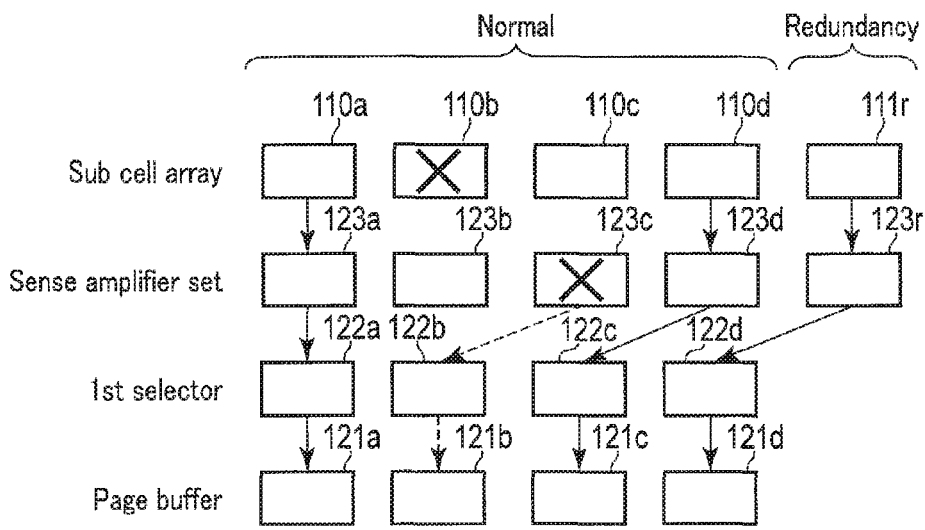
FIG. 8 is a diagram showing a connection example in which a memory cell array and a main sense amplifier are connected according to comparative example 1.

As shown in FIG. 8, the main sense amplifier according to comparative example 1 comprises a sense amplifier set 123, first selectors 122 and page buffers 121. In the case of this comparative example, only the first selectors are provided. If the sub cell arrays include an unusable one and the sense amplifiers include an unusable one, it is not possible to save both the unusable cell array and the unusable sense amplifier.

A description will be given of comparative example 2 with reference to FIG. 9.

Figure 9:
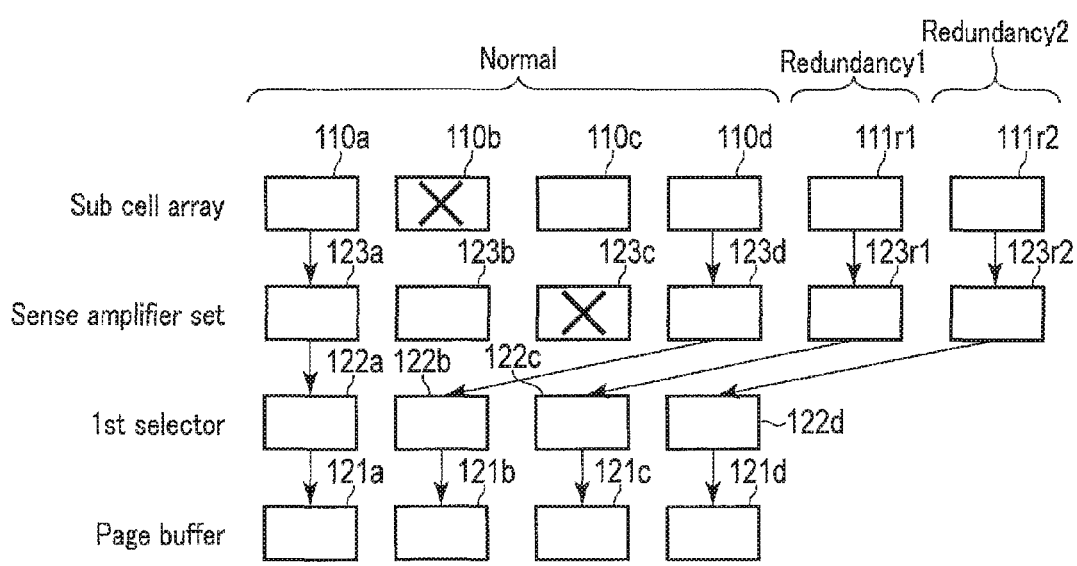
FIG. 9 is a diagram showing connection example in which a memory cell array and a main sense amplifier are connected according to comparative example 2.

According to comparative example 2, a memory cell array employs an additionally provided redundancy area, as shown in FIG. 9. Even if the sub cell arrays include an unusable one and the sense amplifiers include an unusable one, both the unusable cell array and the unusable sense amplifier can be saved. At the same time, however, the additional redundancy area results in an increase in the circuit area. In recent years, semiconductor memory devices with an increased storage capacity are being developed, and how to prevent the increase of the circuit area is a problem. From this viewpoint, the configuration of comparative example 2 is not desired.

According to the foregoing embodiment, however, both an unusable sub cell array and an unusable sense amplifier can be saved with no need to increase the redundancy area. It is therefore possible to provide a semiconductor memory device of high quality, without giving rise to an increase in the circuit area of the semiconductor memory device.

<2> Second Embodiment

A second embodiment will be described with reference to FIG. 10. In the second embodiment, the second selectors perform a different operation from that described above. The basic configuration and operation of the memory device according to the second embodiment are the same as those of the memory device according to the first embodiment. Thus, descriptions of features described in the first embodiment and features easily inferable from the first embodiment will be omitted.

<2-1> Connection Example 5 Between Memory Arrays and Main Sense Amplifier

A description will be given, with reference to FIG. 10, of connection example 5 between the memory cell arrays and the main sense amplifier. In FIG. 10, only five sub cell arrays of a predetermined row, namely sub cell arrays 110a, 110b, 110c, 110d and 111r, are focused for the sake of simplicity. In connection with FIG. 10, it is assumed that the group including an unusable cell array is located closer to the redundancy area than the group including an unusable sense amplifier.

In the test operation performed before the shipping of a semiconductor memory device, if the defect in sub cell array 110d of a row exceeds an allowable value, that sub cell array 110d is regarded as unusable. Likewise, if the defect in sense amplifier 123b exceeds an allowable value, that sense amplifier is regarded as being unusable.

If the sub array 110d of the row becomes unusable, the position information (address) on that sub array 110d is stored in the register 17, for example. The position information (address) on the sub array 110d is stored in the register 17 as "defect information on group d."

If the sense amplifier 123b becomes unusable, the position information (address) on that sense amplifier 123b is stored in the register 17, for example. The position information (address) on the sense amplifier 123b is stored in the register 17 as "defect information on group b."

Upon receipt of an access request made to sub array 110b and sub array 110d, the controller 15 reads "defect information on group b" and "defect information on group d" from the register 17. The controller 15 recognizes that the group including an unusable cell array is closer to the redundancy area than the group including an unusable sense amplifier.

Based on the "defect information on group b", the controller 15 supplies control signal SRD to the first selector 122b of the same group (group b) as sub array 110b. If the group including an unusable cell array is recognized as being closer to the redundancy area than the group including an unusable sense amplifier, the controller 15 also supplies control signal CRDR to the second selector 124c of group c which is adjacent on the redundancy area side.

The controller 15 recognizes that the group including an unusable cell array is located closer to the redundancy area than the group including an unusable sense amplifier. Based on this recognition and "defect information on group d", the controller 15 supplies control signal SCRD to the second selector 124r of group r which is adjacent on the redundancy area side.

Upon receipt of control signal CRDR, second selector 124c is connected to sub cell array 110b of the group located on the opposite side of the redundancy area, not to sub cell array 110c. Upon receipt of control signal CRDR, the second selector 124c supplies control signal SCRDR to second selector 124b located on the opposite side of the redundancy area. Upon receipt of control signal CRDR, second selector 124c supplies control signal CRDRR to the adjacent second selector 124d located on the redundancy area side.

Upon receipt of control signal SCRDR, the second selector 124b does not perform connection to a sub cell array.

Upon receipt of control signal CRDRR, second selector 124d is connected to sub cell array 110c of the group located on the opposite side of the redundancy area, not to sub cell array 110d. Upon receipt of control signal CRDRR, the second selector 124d supplies control signal CRDRR to the adjacent second selector 124r located on the redundancy area side.

Upon receipt of control signal SCRD, second selector 124r does not perform a switching operation even if it receives control signal CRDRR.

Upon receipt of control signal SRD, first selector 122b is connected to sense amplifier 123c of the adjacent group located on the redundancy area side, not to sense amplifier 123b. Upon receipt of control signal SRD, first selector 122b supplies control signal SRD to the adjacent first selector 122c located on the redundancy area.

Upon receipt of control signal SRD, the first selector 122c is connected to the adjacent sense amplifier 123d located on the redundancy area side, not to sense amplifier 123c. Upon receipt of control signal SRD, the first selector 122c supplies control signal SRD to the adjacent first selector 122d located on the redundancy area side.

Upon receipt of control signal SRD, the first selector 122d is connected to sense amplifier 123r of the adjacent group located on the redundancy side, not to sense amplifier 123d.

As described above, where the group including a defective cell array is closer to the redundancy area than the group including a defective sense amplifier, proper replacement is enabled by the first and second selectors even if the shift redundancy system is used.

<2-2> Advantage of Embodiment

As compared with the first embodiment, the second embodiment described above enables an unusable sub cell array and an unusable sense amplifier to be saved in a further flexible manner.

<3> Modifications

The number of sub cell arrays, the number of switches, the number of multiplexers, etc. are merely examples and are not limited to those described above.

In each of the above-described embodiments, defect information on each group is stored in the register 17, but may be stored in the memory cell array 11.

The first selectors have the same function. They operate in the same way upon receipt of predetermined signals. The same hold true of the second selectors as well.

The above embodiments were described referring to the case where the storage is an MRAM. However, the storage may be another type of storage including similar elements to those described in connection with the embodiments. For example, the storage may be a ferroelectric random access memory (FeRAM), a phase change random access memory (PCRAM), or a resistive random access memory (ReRAM).

In connection with the above-described embodiments, the bit line pair was described as having bit line BL and source line SL for descriptive purposes. However, the bit line pair may be referred to as a first bit line and a second bit line.

While certain embodiments have been described, these embodiments have been presented by way of example only, and are not intended to limit the scope of the claims. Indeed, the novel methods and systems described herein may be embodied in a variety of other forms; furthermore, various omissions, substitutions and changes in the form of the methods and systems described herein may be made without departing from the spirit of the embodiments. The accompanying claims and their equivalents are intended to cover such forms or modifications as would fall within the scope and spirit of the embodiments.

What is claimed is:

1. A memory device comprising:
   a first storage area configured to store data;
   a first sense amplifier;
   a first data latch;
   a first selector configured to selectively switch between a first connection and a second connection, the first connection being between the first data latch and the first sense amplifier, and the second connection being between the first data latch and another sense amplifier; and
   a second selector configured to selectively switch between a third connection and a fourth connection, the third connection being between the first storage area and the first sense amplifier, and the fourth connection being between another storage area and the first sense amplifier.

2. The memory device of claim 1, wherein:
   the another sense amplifier is a redundancy sense amplifier, and
   the another storage area is a redundancy storage area.

3. The memory device of claim 1, further comprising:
   a second storage area, which is the another storage area;
   a second sense amplifier, which is the another sense amplifier; and a third selector configured to selectively switch between a fifth connection and a sixth connection, the fifth connection being between the second sense amplifier and the second storage area, and the sixth connection being between the second sense amplifier and the first storage area.

4. The memory device of claim 3, further comprising:
a third storage area;
a third sense amplifier;
a second data latch;
a fourth selector configured to selectively switch between a seventh connection and a eighth connection, the seventh connection being between the second data latch and the third sense amplifier, and the eighth connection being between the second data latch and the first sense amplifier; and
a fifth selector configured to selectively switch between a ninth connection and a tenth connection, the ninth connection being between the third sense amplifier and the third storage area, and the tenth connection being between the third sense amplifier and the first storage area,
wherein the second selector is further configured to selectively switch between the third connection, the fourth connection, and an eleventh connection, the eleventh connection being between the first sense amplifier and the third storage area.

5. The memory device of claim 4, wherein, if the first storage area is unusable:
the first selector selects the first connection,
the second selector selects the fourth connection,
the fourth selector selects the seventh connection, and
the fifth selector selects the ninth connection.

6. The memory device of claim 4, wherein, if the first sense amplifier is unusable:
the first selector selects the second connection,
the third selector selects the sixth connection,
the fourth selector selects the seventh connection, and
the fifth selector selects the ninth connection.

7. The memory device of claim 4, wherein, if the first storage area and the second sense amplifier are unusable:
the first selector selects the first connection,
the second selector selects the fourth connection,
the fourth selector selects the seventh connection, and
the fifth selector selects the ninth connection.

8. The memory device of claim 4, wherein, if the second storage area and the first sense amplifier are unusable:
the first selector selects the second connection,
the third selector selects the sixth connection,
the fourth selector selects the seventh connection, and
the fifth selector selects the ninth connection.

9. The memory device of claim 4, wherein:
upon receipt of a first signal, the first selector selects the second connection, and
upon receipt of the first signal, the fourth selector selects the eighth connection and supplies the first signal to the first selector.

10. The memory device of claim 4, wherein:
upon receipt of a second signal, the second selector selects the fourth connection and supplies the second signal to the third selector, and
upon receipt of the second signal, the fifth selector selects the tenth connection and supplies the second signal to the second selector.

11. The memory device of claim 10, wherein:
upon receipt of a third signal, the second selector does not select the fourth connection and does not supply the second signal to the third selector, even if the second selector receives the second signal, and
upon receipt of the third signal, the fifth selector does not select the tenth connection and does not supply the second signal to the second selector, even if the fifth selector receives the second signal.

12. The memory device of claim 4, wherein:
upon receipt of a fourth signal, the second selector selects the eleventh connection and supplies the fourth signal to the third selector,
upon receipt of the fourth signal, the third selector selects the sixth connection, and
upon receipt of the fourth signal, the fifth selector is further configured to select a twelfth connection, the twelfth connection being between the third sense amplifier and a fourth storage area, and to supply the fourth signal to the second selector.

13. The memory device of claim 12, wherein:
upon receipt of a fifth signal, the second selector selects the third connection and does not supply the fourth signal to the third selector even if the second selector receives the fourth signal,
upon receipt of the fifth signal, the third selector selects the fifth connection, and
upon receipt of the fifth signal, the fifth selector selects the ninth connection and does not supply the fourth signal to the second selector, even if the fifth selector receives the fourth signal.

14. The memory device of claim 4, wherein each of the first, second and third storage areas comprises a plurality of memory cells.

15. The memory device of claim 14, wherein each of the memory cells comprises a resistance change element capable of storing data.

16. The memory device of claim 14, wherein each of the memory cells is one of a magnetoresistive random access memory (MRAM), a ferroelectric random access memory (FeRAM), a phase change random access memory (PCRAM) and a resistive random access memory (ReRAM).

17. A memory device comprising:
a first storage area including a plurality of memory cells arranged in a matrix;
a second storage area;
a first sense amplifier;
a second sense amplifier;
a first selector configured to selectively switch between a first connection and a second connection, the first connection being between the first storage area and the first sense amplifier, and the second connection being between the second storage area and the first sense amplifier; and
a second selector configured to selectively switch between a third connection and a fourth connection, the third connection being between the second sense amplifier and the second storage area, and the fourth connection being between the second sense amplifier and the first storage area.

18. The memory device of claim 17, further comprising:
a third storage area;
a third sense amplifier; and
a third selector configured to selectively switch between a fifth connection and a sixth connection, the fifth connection being between the third sense amplifier and the third storage area, and the sixth connection being between the third sense amplifier and the first storage area, wherein the first selector is further configured to selectively switch between the first connection, the second connection, and a seventh connection, the seventh connection being between the first sense amplifier and the third storage area.

\* \* \* \* \*